Figure 1:
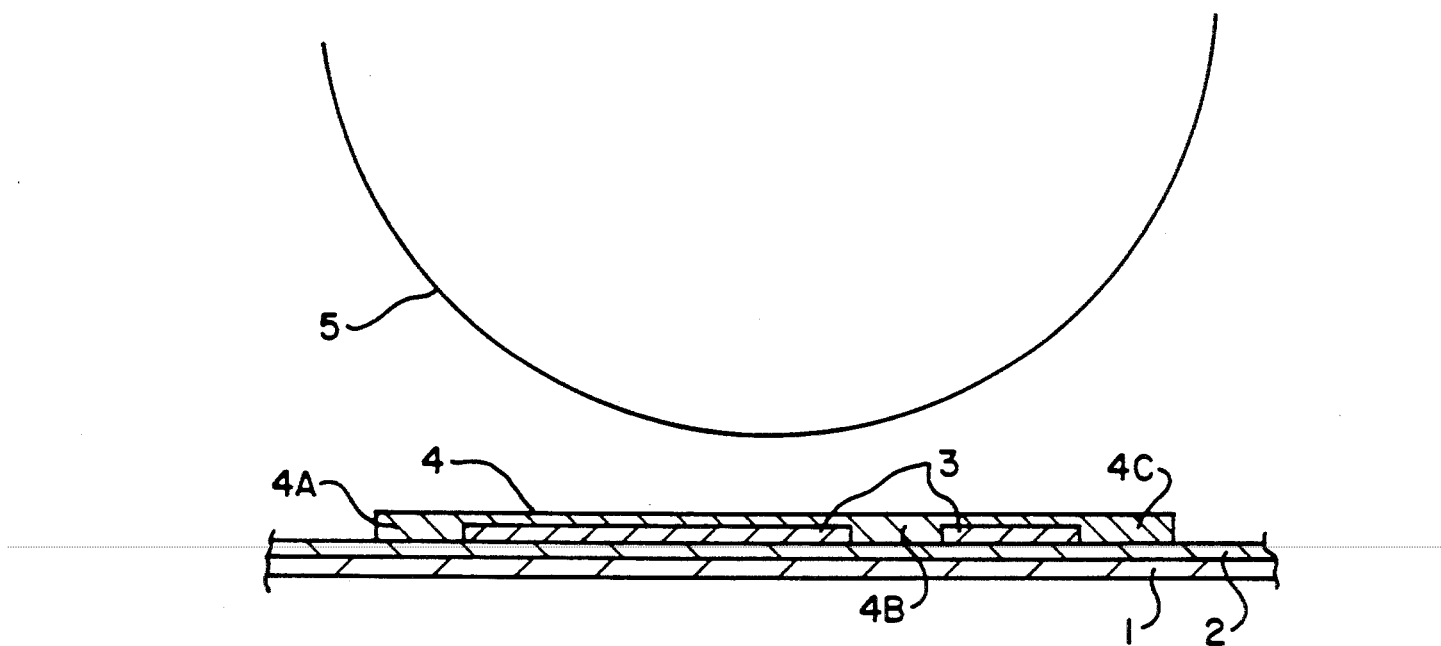

United States Patent [19]

Cole et al.

[11] Patent Number: 5,069,954
[45] Date of Patent: Dec. 3, 1991

[54] TRANSFER FOR AUTOMATIC APPLICATION

[75] Inventors: Donald Cole, Congleton; Robert W. Smith, Stoke-on-Trent, both of United Kingdom

[73] Assignee: 501 Johnson Matthey Public Limited Company, London, England

[21] Appl. No.: 149,355

[22] Filed: Jan. 28, 1988

[30] Foreign Application Priority Data

Jan. 30, 1987 [GB] United Kingdom ............... 8702063

[51] Int. Cl.$^5$ ................... B32B 3/00; B32B 7/00
[52] U.S. Cl. .................... 428/202; 428/204; 428/352; 156/230
[58] Field of Search ............ 156/235, 238, 240, 249, 156/289, 230, 235, 247; 428/40, 41, 42, 352, 347, 914, 200, 202, 204; 40/594

[56] References Cited

U.S. PATENT DOCUMENTS

| 3,007,829 | 11/1961 | Akkeron | 156/89 |
| 3,445,309 | 5/1969 | Milliken | 156/240 X |
| 3,886,020 | 5/1975 | Shank, Jr. | 156/240 |
| 3,967,021 | 6/1976 | Weingrad | 428/40 |
| 4,037,008 | 7/1977 | Tugwell | 428/202 |
| 4,511,425 | 4/1985 | Boyd et al. | 156/235 |
| 4,529,624 | 7/1985 | Hubbard | 427/148 |
| 4,548,857 | 10/1985 | Galante | 156/240 X |

FOREIGN PATENT DOCUMENTS 0055395 7/1982 European Pat. Off. .
2161604 6/1973 France .

Primary Examiner—Michael W. Ball
Assistant Examiner—Louis Falasco
Attorney, Agent, or Firm—Cushman, Darby & Cushman

[57] ABSTRACT

A transfer for use with automatic offset application equipment comprises a backing paper, release layer, design layer and covercoat layer, in which the covercoat layer is formed from a heat-activatable adhesive and extends over an area greater than that of the design layer. Preferably the design layer also has heat-activatable adhesive properties. Such transfers are especially for use with enamel printing inks for the decoration of ceramic ware. In use, a heated platen is used to melt the release layer and a heated pressure pad is brought into contact with the transfer to activate the adhesive and effect the transferring operation.

5 Claims, 1 Drawing Sheet

TRANSFER FOR AUTOMATIC APPLICATION

This invention relates to transfers for use with automatic application equipment and especially automatic offset application equipment in which adhesive activation is by means of heat. The invention is especially applicable to ceramic transfers for the application of a design to a heat-resistant substrate followed by firing to fuse the ceramic component and bond the design to the substrate.

It is known from U.S. Pat. No. 3,967,021 to provide a heat-release transfer or decalcomania in which the design layer is sandwiched between overlying and underlying adhesive layers that are tacky within different predetermined temperature ranges and substantially tack-free outside the said ranges. The underlying adhesive layer is formed on a paper substrate carrying a wax release layer. In use, the transfer is heated to a temperature at which the wax melts and the overlying adhesive layer is tacky, whereby the design layer together with the overlying and underlying adhesive layers may be transferred to the surface of an offset printing pad pressed into contact with the overlying adhesive layer. As the temperature falls, the overlying layer becomes tack-free and the underlying layer becomes tacky whereby, on pressing the pad against the surface of an article of ware, the design layer, together with the overlying and underlying adhesive layers, is transferred thereto and retained thereon by the underlying layer, before firing to adhere the design layer permanently to the ware.

It is also known from European Patent Applications No. 57940 and 55395 to provide a transfer with a layer underlying the design layer and formed from a heat-activatable adhesive and an overlying layer covering substantially the area of the design layer, the overlying layer being formed as a protective layer with no adhesive properties. In use, the transfer is heated to activate the adhesive and melt the wax release layer applied to the backing paper, and an offset pad is pressed sequentially against the upper surface of the design layer and then against the surface of an article of ware, whereupon differential tack properties as between the pad/design layer and ware/underlying adhesive causes the transfer design layer to be transferred from the backing paper to the pad and thence to the ware.

It is also known from Japanese Patent No. 59-41869 to provide a transfer having a wax release layer and a design layer formed from a heat-activatable adhesive ink. In use, the printing pad is brought into contact with the design layer of the previously-heated transfer, such that the design layer becomes transferred to the pad, and the pad bearing the design layer is then brought into contact with the surface of a pre-heated article of ware, whereby the design layer becomes transferred to the ware. This process relies for satisfactory operation on the heating of the transfer, primarily to melt the wax release layer, but also to activate the adhesive properties of the ink to enable transfer of the design layer to the pad to take place.

We have found that, in practice, it is difficult with such known systems to achieve consistent clean transfer without the use of an overlying adhesive layer to aid separation from the backing paper. Furthermore, the development of adhesive properties only within specified temperature ranges, as taught by U.S. Pat. No. 3,967,021, renders the successful operation of the process vulnerable to changes in ambient temperature and/or time delays which result in changes in cooling rate and hence alteration of the adhesive properties.

It is an object of the present invention to provide a transfer which overcomes the disadvantages of the prior art in respect of simplicity and reproducibility of application when using automatic application equipment.

According to the invention, a transfer for use with automatic application equipment comprises a backing paper, release layer, design layer and overcoat layer, wherein the covercoat layer is formed from a heat-activatable adhesive and extends over an area greater than that of the design layer.

The extent of the covercoat layer in relation to the design layer provides marginal portions of the covercoat the lower surface of which is exposed to and in direct contact with the release layer.

Preferably, the design layer also has heat-activatable adhesive properties, particularly where the invention is for use with ceramic transfers, that is, transfers including an enamel design layer and for application to a heat-resistant substrate with subsequent firing, since intimate contact between the design layer and the substrate is necessary for a high-quality fired product.

In transfers according to the invention, the ink and the covercoat material are chosen so that when activated, the ink and exposed lower surface areas of the covercoat layer have a lower coefficient of adhesion to the release layer than does the upper surface of the covercoat layer to the surface of an offset printing pad (such as a silicone "bomb") but a higher coefficient of adhesion to the surface of an article of ware, thereby permitting clean separation of the design layer initially from the backing paper to the pad and thence from the pad to the ware. For this purpose, the ink may have its maximum coefficient of adhesion within a different temperature range compared with the temperature range of maximum coefficient of adhesion of the covercoat material. By "coefficient of adhesion", we mean the adhesion or tackiness of the material in question relative to the material with which it is in contact. Thus, the adhesion of the ink may be considered either in relation to the backing paper or to the surface of the ware, and the adhesion of the covercoat layer is generally considered in relation to the surface of the printing pad, although it will be appreciated that the marginal lower surface areas of the covercoat will be in contact with the backing paper and the ware at different times during the application process, due to the covercoat extending in area beyond the limits of the design layer. The coefficient of adhesion will be influenced not only by the nature and intrinsic tackiness of the adhesive material but also by the nature of the material with which it is in contact. The attainment of the maximum coefficient of adhesion for the respective materials in different temperature ranges enables clean transfer of the design layer from the backing paper to the ware, via the printing pad, to be achieved.

The invention also includes a process for automatic application of a pattern to the surface of an article of ware using a transfer comprising a backing paper, release layer, design layer and covercoat layer, the covercoat layer being formed from a heat-activatable adhesive and extending over an area greater than that of the design layer to provide marginal exposed portions of the covercoat layer, the process comprising applying the transfer to a heated platen to melt the wax release layer, bringing a heated printing pad into contact with the covercoat layer to activate the adhesive properties of the said layer, withdrawing the printing pad including the said covercoat and design layers, bringing the pad including the said layers into contact with the surface of an article of ware, and withdrawing the pad, the coefficient of adhesion of the covercoat layer relative to the printing pad being less than the coefficient of adhesion of the marginal portions of the covercoat layer relative to the ware, whereby the said layers are transferred from the pad to the ware.

When the inventive process is used with ceramic transfers, the ware is subjected to a final firing step to burn off the organic components and fuse the design to the ware.

The use of a heated platen and pad and unheated ware in the process of the invention enables more reproducible control of the coefficients of adhesion of the materials during the operation of the process, compared with known techniques. In particular, the design and covercoat layers are subject to pre-determinable elevated temperatures throughout the process to the point of being brought into contact with the ware. The adverse effects of uncontrollable ambient temperature conditions on the coefficients of adhesion at the various stages are thus avoided or, alternatively, the use of thermostatically-controlled chambers to ensure proper temperature control is avoided.

By "design layer" in this specification and claims is meant a pattern for example in the form of a decoration, lettering, numbering, graphical or pictorial instruction, or to define an electrical circuit, being intended to be visible to the eye or have electrically conductive or resistive properties, formed from one or more preferably tackifying printing inks by screen or other printing techniques on the wax release layer applied to the backing paper. The printing inks comprise pigments or metal particles having a desired property of colour, opacity or electrical conductivity or resistivity and preferably, for ceramic applications, a vitreous phase in particulate form, dispersed in a printing medium which imparts to the ink a suitable printing viscosity, which dries to form an essentially non-tacky film at ambient temperatures in air and which preferably becomes tacky when heated to elevated temperatures.

The covercoat layer is formed from a heat-activatable adhesive and preferably extends over substantially the entire surface area of the transfer, that is to say, over exposed parts of the backing paper as well as over the design layer. Thus one purpose of the covercoat layer is to act as a carrier for the design layer following separation from the backing paper and until application to an article of ware, to maintain the integrity of the design layer during the transfer process. The covercoat layer outside the area of the design should also adhere to the ware under pressure in preference to the pad, the convex working surface of the pad preferably comprising silicone or other material having release characteristics.

The backing paper may be a standard transfer backing paper of the type known in the art and carrying a coating or film of a wax or other release medium which melts on application of heat.

Thus, in the use of transfers according to the invention, the transfer is initially heated on the platen, to which it is preferably held by suction, to melt the wax release layer. The heated transfer pad, which is resilient and of convex shape so that a central zone makes initial contact with the transfer and then flattens over the entire covercoat area on being pressed against the transfer, is then applied to the upper surface of the covercoat layer which develops tack and hence readily lifts off the backing paper, together with the design layer, on withdrawal of the transfer pad, since the molten wax release layer has no cohesive strength. The pad, bearing the covercoat and design layers, is then applied to the surface of an article of ware and the marginal exposed lower surface areas of the covercoat layer adhere preferentially to the ware, owing to the release characteristics of the material of the pad. On starting to withdraw the pad, therefore, the marginal edge regions of the covercoat layer are released form the pad and remain in adhesion with the ware, and the central area including the design layer is thereby held firmly in place on the ware as the pad is completely withdrawn. For the application of ceramic transfer to heat-resistant substrates, the design layer is formed from an enamel, that is, includes a vitreous phase as well as pigments or metal particles, and to achieve a high-quality fired product it is necessary to have intimate contact between the unfired enamel and the substrate. Preferably, therefore, particularly for ceramic transfers, the design layer will also exhibit adhesive properties to facilitate clean transfer from the pad and satisfactory subsequent firing.

We have found that a suitable degree of tackiness for the printing ink, to render it suitable for use in the design layer, is a slight or "pasty" tack which may be achieved by the addition of pigment or metallic powder, and preferably vitreous phase, to a heat-activatable adhesive ink medium. Expressed alternatively, the tackiness of an intrinsically tacky ink medium may be reduced to a "pasty" tack by the addition of pigment or metallic powder and preferably a vitreous phase. Thus, suitable relative degrees of tackiness, at different temperatures, are as follows:

| TEMPERATURE | TACKINESS | | |
| --- | --- | --- | --- |
| $0_c$ | INK MEDIUM | INK | COVERCOAT |
| 55 | Slight | Nil | Slight |
| 75 | Tacky | Nil | Tacky |
| 100 | Tacky | Slight | Tacky |
| 130 | Tacky | Slight | Very slight |

The above determinations were made by applying the materials as a film to a glass slide and assessing the degree of tackiness by hand.

The printing ink medium is an acrylic resin, preferably a methacrylic resin. We have found that a suitable resin for good application, tack and firing properties is a copolymer of butyl methacrylate and methyl methacrylate, preferably controlled to a molecular weight range of approximately 20–30,000. Furthermore, to enhance the softness or pliability of the transfer, in particular for application to shaped ware, it is preferred to include a plasticiser such as dioctyl phthalate or dimethyl cyclohexyl phthalate.

The covercoat can be either acrylic or cellulosic. We have found that ethyl cellulose is a suitable film-forming resin which has a degree of tackiness while molten and hardens very quickly on cooling. This however needs the presence of a compatible tackifying agent such as sucrose acetate isobutyrate for efficient operation of the process.

In the preparation of transfers according to the invention, methods and techniques known in the art of ceramic transfers may be employed. For example, design layers may be screen printed through screens formed from a variety of materials to a variety of mesh sizes, such as 120 mesh (threads per inch) steel screens or 460 mesh synthetic fibre screens (corresponding respectively to 47 and 181 threads cm$^{-1}$). Typically, for ultimate decoration of glass a 300 mesh (metric 118) steel screen is used and for ultimate decoration of pottery a 305 mesh (metric 120) synthetic fibre screen is used. In printing ink formulations for transfer according to the invention, standard enamel:medium ratios may be employed, where the enamel is a mixture of pigment or other colouring material and glass or vitreous frit. Typically, for ultimate decoration of glass substrates, a range of from 250 to 300 parts by weight of enamel to 100 parts by weight of medium may be used, and for ultimate decoration of pottery substrates a range of from 150 to 250 parts by weight of enamel to 100 parts by weight of medium may be used, although in the case of special enamels such as micaceous enamels lower amounts may be used, for example 50 parts to 100 parts of medium, the limits being dictated by opacity at lower levels of enamel and printing rheology at higher levels. The different ratios for the respective substrates are related to the firing requirements, in that glass enamels comprise a frit containing a higher proportion of lead, to lower the firing temperature compared with pottery enamels. Hence glass enamels are denser product and therefore, to maintain the volume fraction of the frit in the ink, a higher weight concentration is required.

Transfers according to the invention may be applied to ceramic or vitreous ware or other heat-resisting substrates such a alumina using existing equipment such as the HR200 Decalcomania Application Machine available from Service (Engineers) Limited, or the Netzsch thermal application machine for decals. Typically, the pad is maintained at a temperature of 100°–130° C. and a heated vacuum platen or base plate is maintained at a temperature of 70°–100° C., depending on size of design layer, shape of pad and ware, and type of pad material. Typically, the pad resides on the ware for approximately half a second to ensure adequate adhesion of the design layer to the ware. It is to be understood, however, that temperatures and residence times may be varied according to the requirements of particular transfers according to the invention.

Where the invention comprises a ceramic transfer, and after application to an article of ware or other substrate, the substrate is fired to burn off the organic components, fuse the vitreous components and bond the design to the substrate. It is preferred that, during the early stages of the firing cycle, the ink medium has sufficient tackiness to prevent any lifting or other effect which would lead to the development of cracks or other firing defects to the design layer. Any residual wax transferred to the substrate beneath the design layer is also burnt off during the firing stage.

The invention will now be described by way of example with reference to formulations for printing media for the design layer and covercoat layer, all figures being in parts by weight.

| Printing medium: | | |
|---|---|---|
| H74 medium | (BASF) | 45 |

| -continued | | |
|---|---|---|
| 80661 medium | (Degussa) | 45 |
| G4246 tackifier | (Blythe Colours) | 10 |
| Covercoat layer: | | |
| Ethyl cellulose N50 | (Hercules) | 10 |
| Sucrose acetate iso-butyrate | (Eastman) | 10 |
| Clairsol 330 | | 40 |
| Oxitol acetate | solvents | 24 |
| Pentan-1-ol | | 16 |

The above printing medium formulation, when dispersed with an enamel to form a printing ink and screen printed on a transfer backing paper such as HR4000 release paper (Brittains) and covered with a screen-printed layer of the covercoat formulation, produced a transfer according to the invention and which, on application to ware as described gave differential tackiness as between the release paper, printing pad and ware to enable a smooth transferring operation to take place, and exhibited satisfactory firing properties without any cracking, bubbling, blistering or other imperfections becoming apparent.

A transfer according to the invention is illustrated diagrammatically by way of example in accompanying FIG. 1. In the Figure, the transfer consists of a backing paper 1, release layer 2, design layer 3 and covercoat layer 4. The surface of a resilient transfer pad is shown at 5, in position above the transfer and ready to be brought into contact therewith to remove the design and covercoat layers from the backing paper.

It is seen that the covercoat extends beyond the limits of the design layer to provide marginal portions 4A, 4B and 4C which are in contact with the release layer 2.

We claim:

1. A ceramic transfer for use with automatic offset application equipment wherein the transfer is applied to ware by means of a printing pad, the transfer comprising, in sequence, a backing paper, release layer, design layer and covercoat layer, in which the covercoat layer is formed from a heat-activatable adhesive and extends over an area greater than that of the design layer so as to cover the design layer and provide a marginal portion of the covercoat layer which is in direct contact with the release layer, and the design layer is formed from a printing ink the medium of which has heat-activatable adhesive properties, the covercoat layer being such that when its adhesive is heat-activated, the marginal portion thereof has a lower coefficient of adhesion to the release layer than for the printing pad and the covercoat has a lower coefficient of adhesion for the printing pad than the marginal portion of the covercoat and the design layer have for the ware so that the design layer can be separated from the release layer and transferred to the ware by the pad.

2. A transfer according to claim 1, in which the maximum tackiness of the covercoat and design layers respectively are attained at different temperatures.

3. A transfer according to claim 1, in which the covercoat layer comprises an acrylic or a cellulosic resin.

4. A transfer according to claim 1, in which the medium of the design layer comprises an acrylic resin.

5. A transfer according to claim 4, in which the resin comprises a copolymer of butyl methacrylate and methyl methacrylate and has a molecular weight within the approximate range 20,000–30,000.

* * * * *